United States Patent [19]

Masuda et al.

[11] Patent Number: 4,613,970
[45] Date of Patent: Sep. 23, 1986

[54] INTEGRATED CIRCUIT DEVICE AND METHOD OF DIAGNOSING THE SAME

[75] Inventors: Ikuro Masuda; Hideo Maejima; Terumine Hayashi; Kazumi Hatayama, all of Hitachi, Japan

[73] Assignee: Hitachi, Ltd., Tokyo, Japan

[21] Appl. No.: 575,706

[22] Filed: Jan. 31, 1984

[30] Foreign Application Priority Data

Feb. 4, 1983 [JP] Japan .................................. 58-16045

[51] Int. Cl.$^4$ ........................................... G01R 15/12
[52] U.S. Cl. .................................... 371/25; 324/73 R
[58] Field of Search ............................ 371/25, 21, 15; 324/73 AT, 73 PC, 73 R

[56] References Cited

U.S. PATENT DOCUMENTS

| | | | |
|---|---|---|---|
| 4,329,640 | 5/1982 | Reiner et al. | 324/73 AT |
| 4,404,519 | 9/1983 | Westcott | 324/73 AT |
| 4,503,386 | 3/1985 | Das Gupta et al. | 371/25 |
| 4,503,387 | 3/1985 | Rutledge et al. | 371/25 |
| 4,527,115 | 7/1985 | Mehrotra et al. | 371/25 |

Primary Examiner—Michael R. Fleming
Attorney, Agent, or Firm—Antonelli, Terry & Wands

[57] ABSTRACT

A method of diagnosing an integrated circuit device having a plurality of combinational circuits, at least one input memory circuit connected to an input side of the combinational circuits, and an output memory circuit connected to an output side of the combinational circuits is disclosed. An input diagnostic signal is selectively applied to at least one input memory circuit connected to a given one of the combinational circuits, to read out a diagnostic signal stored in an output memory circuit connected to the given combinational circuit. Further, an integrated circuit device is disclosed which is suited to be diagnosed in the above method.

10 Claims, 10 Drawing Figures (a)

(b)

(c)

(d)

INTEGRATED CIRCUIT DEVICE AND METHOD OF DIAGNOSING THE SAME

BACKGROUND OF THE INVENTION

The present invention relates to an integrated circuit device, and more particularly to an integrated circuit device, for which a fault diagnosis can be readily made, and a method of diagnosing the same.

In an integrated circuit device including logic circuits, it is judged whether various elements have desired functions and performance or not, by applying an input signal indicative of a test pattern to the integrated circuit device. Such judgment is generally called "diagnosis". In making a diagnosis, it is required to use a series of input signals capable of diagnosing almost all of the elements included in the integrated circuit. A ratio of the number of diagnosable elements to the total number of elements included in the integrated circuit is defined as the rate of diagnosis. Accordingly, it is required for a series of input signals to be able to obtain a practically satisfactory rate of diagnosis by the smallest possible numbers of steps. For an ordinary integrated circuit device, thousands of steps are required to obtain a satisfactory rate of diagnosis.

The above-mentioned series of input signals has hitherto been produced manually, and therefore a large amount of work is required. Specifically, for a gate array integrated circuit device whose design work is automated for the most part and whose design period is shortened to about one month, a ratio of a period for producing a series of input signals for diagnostic use to the design period is inevitably increased. This is the most serious obstacle to the shortening of development period.

Further, it has been proposed and tried to automatically produce a series of input signals by means of an electronic computer. In many cases, however, a satisfactory rate of diagnosis is not obtained unless certain restrictions are imposed on logical construction.

As described in a Japanese patent application specification (Laid-open No. 133644/1982), the following methods have been used to solve the above-mentioned problems. In one of the methods, that is, in the scanin scan-out method, flip-flops included in an integrated circuit are connected in series to form a shift register, an input signal is applied to the integrated circuit through the shift register to operate the integrated circuit, and the result of the operation is delivered to the outside through the shift register. In the other method, a shift register for diagnostic use only is provided on a semiconductor substrate at a peripheral portion thereof, desired parts of an integrated circuit which is formed on the semiconductor substrate in accordance with a master slice method, are connected to bits of the shift register by wiring, and the outputs from the desired parts are applied to the shift register in parallel, and then taken out of the shift register in series with the aid of a shift clock.

In these conventional methods, it is possible to diagnose a plurality of combinational logic circuits, but it is impossible to diagnose individual combinational logic circuits. Therefore, the rate of diagnosis is decreased.

Further, a Japanese patent application specification (Laid-open No. 87142/1979) shows a structure in which flip-flops can operate in an ordinary mode and moreover can be accessed directly through selection of select wiring in a diagnostic mode. In this structure, however, only the flip-flops are diagnosed, and it is impossible to diagnose a logic circuit including a combinational circuit.

Furthermore, a Japanese patent application specification (Laid-open No. 93430/1981) discloses that a given one selected from flip-flops is caused to perform a latch operation, and the remaining flip-flops are converted into combinational circuits. In such a prior art, however, only the flip-flops are diagnosed, and it is impossible to diagnose a circuit part including a combinational circuit.

SUMMARY OF THE INVENTION

It is an object of the present invention to provide an integrated circuit device in which the above-mentioned problems are eliminated, individual combinational circuits can be diagnosed and a satisfactory rate of diagnosis is obtained, and further to provide a method of diagnosing the integrated circuit device.

In order to attain the above object, according to an aspect of the present invention, there is provided a method of diagnosing an integrated circuit device having a plurality of combinational circuits, at least one input memory circuit connected to an input side of the combinational circuits, and an output memory circuit connected to an output side of the combinational circuits. Basically, this method includes a step of selectively applying an input diagnostic signal to at least one input memory circuit connected to a given one of the combinational circuits, followed by a step of reading out a diagnostic signal stored in an output memory circuit connected to the given combinational circuit.

Further, according to another aspect of the present invention, there is provided an integrated circuit device having, on a semiconductor chip, a plurality of combinational circuits, at least one input memory circuit connected to an input side of the combinational circuits and an output memory circuit connected to an output side of the combinational circuits. The device further includes a plurality of pads formed on the semiconductor chip at a peripheral portion thereof and a plurality of input/output buffers connected between the input and output memory circuits and the pads. At least one of the input/output buffers is connected to a signal line which is adapted to transmit an address signal for selecting a given one of the input memory circuits, and at least another one of the input/output buffers is connected to a signal line for reading out a diagnostic signal which is selectively stored in the output memory circuit.

The term "combinational circuit" means a logic circuit whose output signal is univocally determined by an input signal applied thereto, and includes, for example, an AND circuit, an OR circuit, a NOT circuit, a NAND circuit, a NOR circuit, an XOR circuit, a combination of these circuits (such as a half adder, a full adder, a sign reversing circuit, an encoder, or a decoder), and a wiring conductor whose input and output signals are identical with each other. Further, the term "memory circuit" means a logic circuit whose output signal depends upon what kind of operation was performed in the past by an input signal, and includes, for example, static memory means such as a flip-flop, dynamic memory means such as the electrostatic capacitance of a transistor, and a circuit obtained by combining these means.

Other objects and features of the present invention will become more apparent from the following explanation of embodiments.

BRIEF DESCRIPTION OF THE DRAWINGS

The present invention will be apparent from the following detailed description taken in conjunction with the accompanying drawings, in which.

DETAILED DESCRIPTION OF THE INVENTION

Now, the present invention will be explained below in detail, on the basis of embodiments thereof.

EMBODIMENT 1

First, the principle of the present invention will be explained, with reference to FIG. 1.

Figure 1:
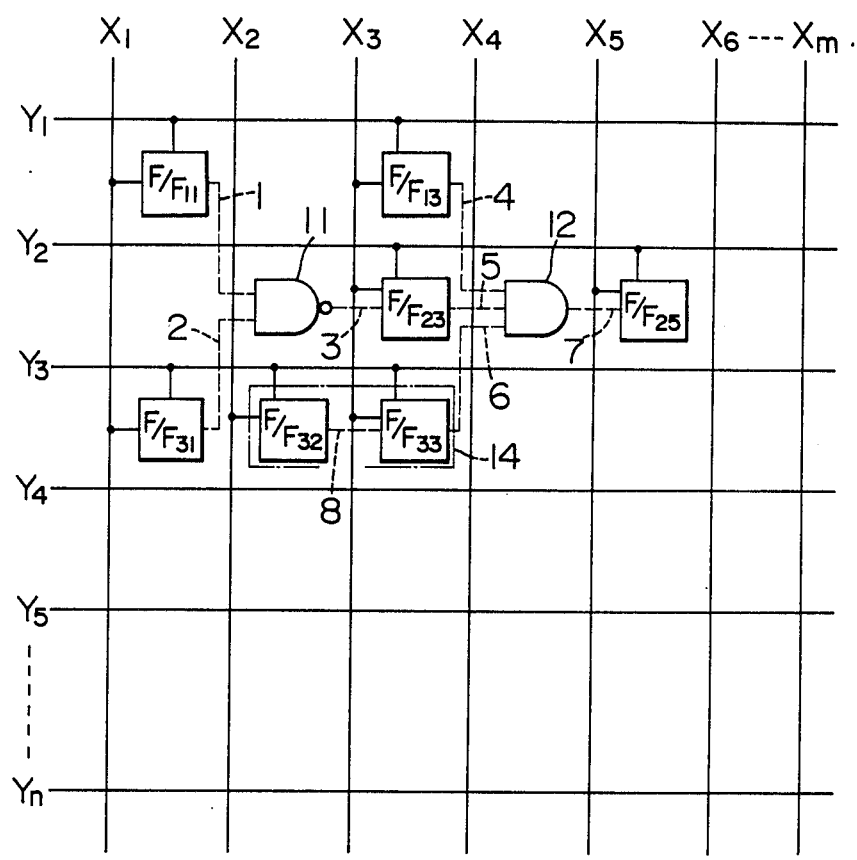
FIG. 1 is a schematic view for explaining the principle of the present invention.

As shown in FIG. 1, two combinational circuits (that is, a 2-input NAND circuit 11 and a 3-input AND circuit 12) and six memory circuits (that is, flip-flops $F/F_{11}$, $F/F_{13}$, $F/F_{23}$, $F/F_{25}$, $F/F_{31}$, $F/F_{32}$ and $F/F_{33}$) are arranged in the form of a matrix, and connected with conductors 1 to 8 which are indicated by broken lines. The flip-flops $F/F_{32}$ and $F/F_{33}$ make up a shift register, and the conductor 8 connected between these flip-flops is a kind of combinational circuit. The flip-flops $F/F_{11}$ and $F/F_{31}$ are connected to the input terminals of the 2-input NAND circuit 11, and act as input memory circuits of the NAND circuit 11. The flip-flop $F/F_{23}$ is connected to the output terminal of the NAND circuit 11 to act as the output memory circuit thereof. Further, the output terminal of the flip-flop $F/F_{23}$ is connected to an input terminal of the 3-input AND circuit 12, and thus the flip-flop $F/F_{23}$ acts also as an input memory circuit of the AND circuit 12. Further, the flip-flop $F/F_{13}$ acts as another input memory circuit of the AND circuit 12, and the flip-flop $F/F_{25}$ acts as the output memory circuit of the AND circuit 12. The flip-flop $F/F_{33}$ acts not only as another input memory circuit of the AND circuit 12 but also as the output memory circuit of the conductor 8. The flip-flop $F/F_{32}$ acts as an input memory circuit of the conductor 8. In FIG. 1 reference symbols $X_i$ and $Y_j$ (where $i=1$ to m and $j=1$ to n) designate address signals transmitted by address signal lines (indicated by straight lines) for selecting a given flip-flop, and other combinational circuits, memory circuits and signal lines are omitted for brevity's sake.

Now, let us consider the case where the 2-input NAND circuit 11 is selectively diagnosed, by way of example. First, the flip-flops $F/F_{11}$ and $F/F_{31}$ are selected by the address signals $X_1$, $Y_1$ and $Y_3$, and applied with an input diagnostic signal in a diagnostic mode. Next, a diagnostic signal which is obtained as the result of the logical operation performed by the NAND circuit 11, is stored in the flip-flop $F/F_{23}$ in an ordinary mode, and then the diagnostic signal stored in the flip-flop $F/F_{23}$ is read out to the outside through a signal line (not shown) in a diagnostic mode.

The 3-input AND circuit 12 and conductor 8 can be diagnosed in a similar manner.

EMBODIMENT 2

An embodiment of a gate array integrated circuit device according to the present invention will be explained below in detail.

Figure 2:
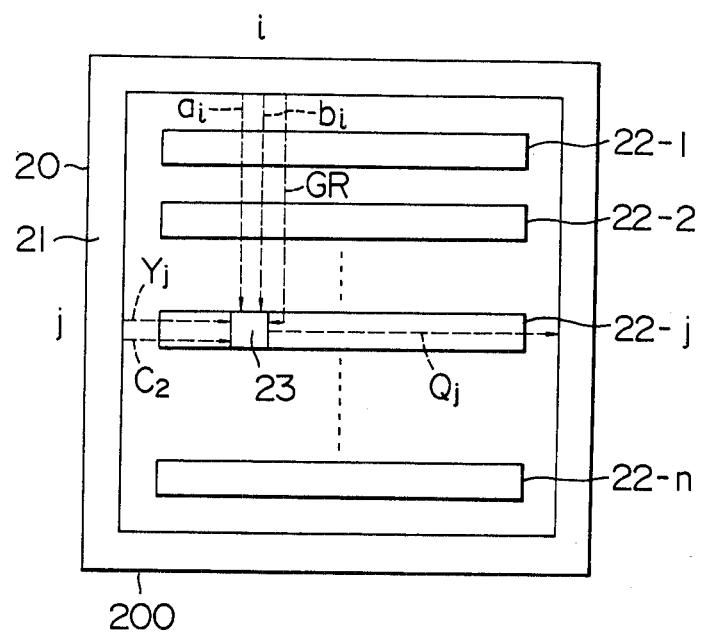
FIG. 2 is a schematic view showing the whole structure of an embodiment of a gate array integrated circuit device according to the present invention.

FIG. 2 shows an outline of the whole of the embodiment (that is, a gate array integrated circuit device 20). In the present embodiment, an input/output buffer group 21 and an array of gate groups 22-1, 22-2, ..., 22-j, ... and 22-n are formed on a semiconductor chip 200.

Now, explanation will be made of a procedure for writing external diagnostic data in, for example, a flip-flop 23 which is the i-th flip-flop in the j-th gate group 22-j, (that is, for performing a scan-in operation), and for reading out diagnostic data which is obtained as the output of the flip-flop 23, to the outside (that is, for performing a scan-out operation).

(1) Initialization of flip-flops

All flip-flops are reset by a general reset signal GR shown in FIG. 2 to start a diagnostic operation. Thus, the contents of each flip-flop are reset, and take the level of "0".

(2) Setting of "1" in a flip-flop (scan-in operation)

As mentioned above, all of the flip-flops are reset at the beginning of the diagnostic operation. Thereafter, the flip-flop 23 is set for diagnostic purposes. Signals $a_i$ and $b_i$ corresponding to the i-th column, a row address signal $Y_j$ specifying the j-th row, and a second clock signal $C_2$ are used to select and set the flip-flop 23. The signals $a_i$, $b_i$, $Y_j$ and $C_2$ will be explained later in detail.

(3) Read-out of data resulting from the operation of flip-flop (scan-out operation)

The flip-flop 23 is selected from the flip-flops included in the j-th gate group 22-j, by the signal $b_i$, and the contents of the flip-flop 23 are delivered, as an output signal $Q_j$, to a data output signal line, to be sent to the outside of the device 20 through the input/output buffer group 21.

Figure 3:
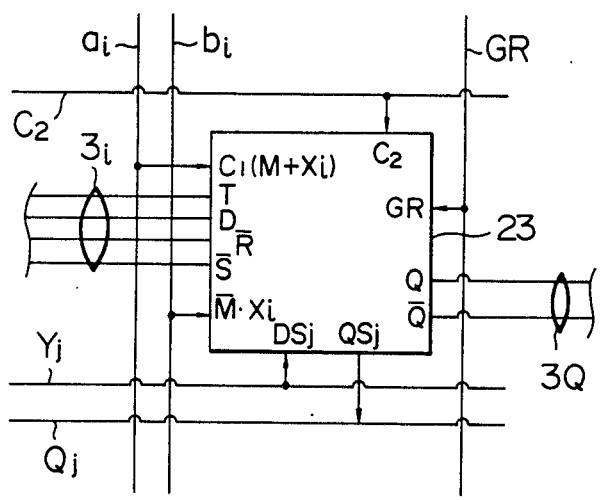
FIG. 3 is a view showing the interface of the flip-flop 23 shown in FIG. 2.

FIG. 3 shows the connection of the flip-flop 23 with input and output signal lines. Referring to FIG. 3, in addition to input signal lines 3i (for transmitting a clock signal T, a data signal D, a reset signal $\overline{R}$ and a set signal $\overline{S}$) and output signal lines 3Q which are necessary for the flip-flop 23 to perform its own function, signal lines for diagnosing the flip-flop 23 are connected thereto in such a manner that a lattice is formed.

Figure 4:
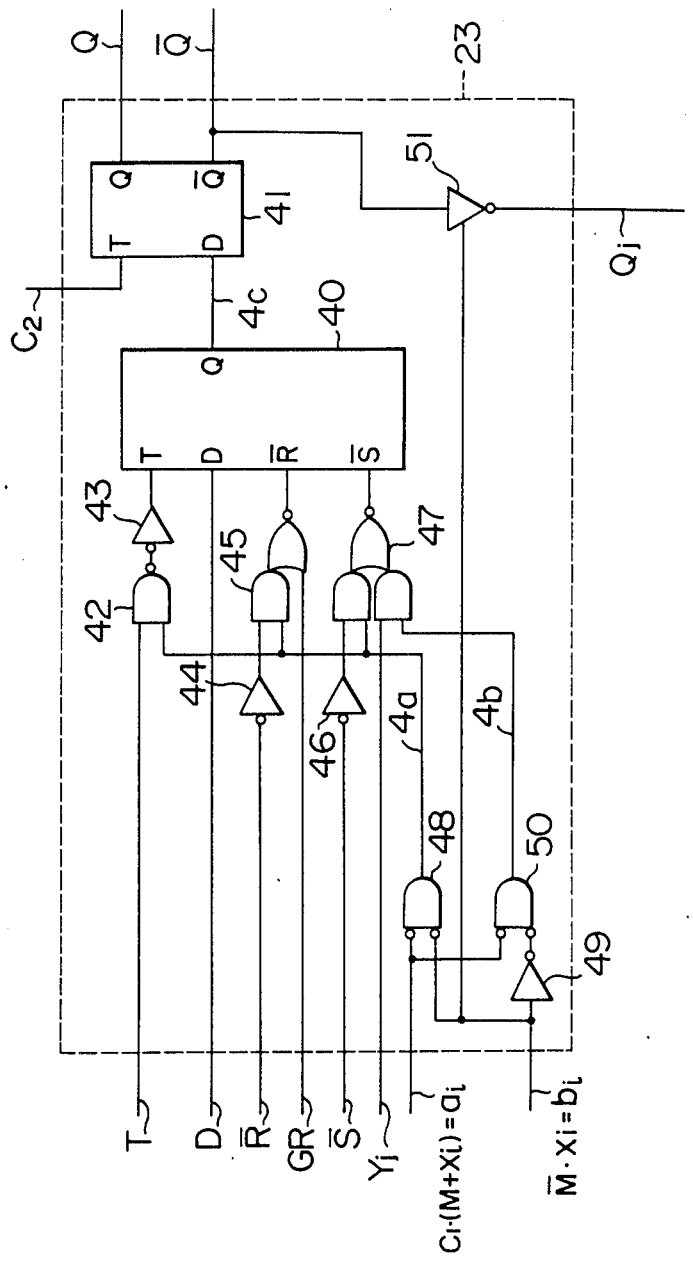
FIG. 4 is a circuit diagram showing the inner structure of the flip-flop 23 shown in FIG. 2.

Next, the operation of the flip-flop 23 will be explained below in detail, with reference to FIG. 4 showing the circuit configuration of the flip-flop 23.

The flip-flop 23 includes flip-flops 40 and 41 forming a main part of the flip-flop 23, logic gates 42 to 50 for diagnostic use, and a gate 51 for reading out the contents of the flip-flop 23. Prior to explaining the operation principle of the flip-flop 23, the meaning of each of signals M, $C_1$, $C_2$, $a_i$, and $b_i$ will be clarified.

(1) Mode specifying signal M

The flip-flop 23 to be diagnosed is put in an ordinary mode or a diagnostic mode, depending upon whether the mode specifying signal M takes the level of "1" or the level of "0".

(2) First clock signal $C_1$

The first clock signal $C_1$ is used in making a diagnosis, and serves as a signal for determining a time the flip-flop 40 is put in a diagnostic mode.

(3) Second clock signal $C_2$

The second clock signal $C_2$ is used in making a diagnosis, and serves as a signal for determining a time the data set in the flip-flop 40 is delivered in a diagnostic mode.

(4) Signal $a_i$

The signal $a_i$ is produced as the result of the logical operation given by the following equation:

$$a_i = \overline{C_1 \cdot (M + X_i)} \tag{1}$$

where $X_i$ indicates a column address signal for selecting a column which contains the flip-flop 23. That is, in both the case where the flip-flop 23 is put in an ordinary mode (that is, the mod=specifying signal M takes the level of "1") or the case where the flip-flop 23 is put in a diagnostic mode (that is, the signal M takes the level of "0"), the first clock signal $C_1$ is enabled, when the i-th column containing the flip-flop 23 is selected.

(5) Signal $b_i$

The signal $b_i$ is produced as the result of the logical operation given by the following equation:

$$b_i = M \cdot X_i \tag{2}$$

That is, the signal $b_i$ takes the level of "1" only when the flip-flop 23 is put in a diagnostic mode and further when the i-th column is selected.

Next, the operation of the flip-flop 23 in a diagnostic mode will be explained, using the above signals.

(a) Gate 48

When the i-th column containing the flip-flop 23 is selected, the column address signal $X_i$ takes the level of "1", and therefore the signal $b_i$ takes the level of "1". Accordingly, an output signal 4a from the gate 48 takes the level of "0", and thus the clock signal T, reset signal $\overline{R}$ and set signal $\overline{S}$ applied respectively to the gates 42, 45 and 47 are disabled.

(b) Gate 50

When the i-th column containing the flip-flop 23 is selected, the clock signal $C_1$ contained in the signal $a_i$ can pass through the gate 50 since the signal $b_i$ is applied to the gate 50 after being inverted by the gate 49. Thus, an output signal 4b from the gate 50 takes the level of "1". Accordingly, the set signal $\overline{S}$ is supplied from the gate 47 to an $\overline{S}$-terminal (namely, a set terminal) of the flip-flop 40, only when the row address signal $Y_j$ takes the level of "1" (that is, the j-th row is selected). Thus, a value "1" is set in the flip-flop 40 (scan-in operation).

Incidentally, each of the gates 43, 44 and 46 is an inverter for causing a corresponding signal to have a desired polarity.

Further, when the signal $b_i$ takes the level of "1", that is, the flip-flop 23 is selected, the contents of the flip-flop 41 are delivered, as the data output signal $Q_j$, to the outside of the flip-flop 23 on the basis of the operation of the gate 51.

In a diagnostic mode, however, the following items (i) and (ii) have to be considered.

(i) Processing for setting output data signal D from a combinational logic circuit under diagnosis into flip-flop 40 (flip-flop in).

When the first clock signal $C_1$ takes the level of "1" in an ordinary mode, the signals $a_i$ and $b_i$ take the level of "0", and thus the output signal 4a of the gate 48 takes the level of "1". Accordingly, one input terminal of the gate 42 is kept at the level of "1", and therefore the data signal D can be set in the flip-flop 40 in response to the clock signal T.

(ii) Processing for preventing output of flip-flop 40 from being delivered to next stage In order to prevent a combinational circuit at the next stage from being affected by the outputs Q and $\overline{Q}$ of the flip-flop 23, the flip-flop 41 is connected between the flip-flop 40 and the next stage. In an ordinary mode, an output 4c from the flip-flop 40 can pass through the flip-flop 41 by keeping the clock signal $C_2$ applied to the flip-flop 41 at the level of "1". Further, in a diagnostic mode, the contents of the flip-flop 41 are made equal to those of the flip-flop 40 by applying the clock signal $C_2$ to the flip-flop 41, and then delivered, as the data output signal $Q_j$, to the outside through the gate 51.

The levels of the signals M, $C_1$ and $C_2$ in each of the ordinary and diagnostic modes will be listed in the following table.

TABLE 1

| mode | | signal | | |
|---|---|---|---|---|
| | | M | $C_1$ | $C_2$ |
| ordinary mode | | 1 | 1 | 1 |
| diagnostic mode | scan in | 0 | | 0 |
| | | 0 | | |
| | flip-flop in | 1 | 1 | 0 |
| | pin out | 1 | 0 | 0 |
| | scan out | 0 | 0 | | where the term "flip-flop in" means an operation for storing the data signal D in the flip-flop 23 in an ordinary mode, and the term "pin out" means an operation for checking the state of a pin acting as an output buffer, in an ordinary mode, without varying the inner state of an integrated circuit device.

Figure 5:
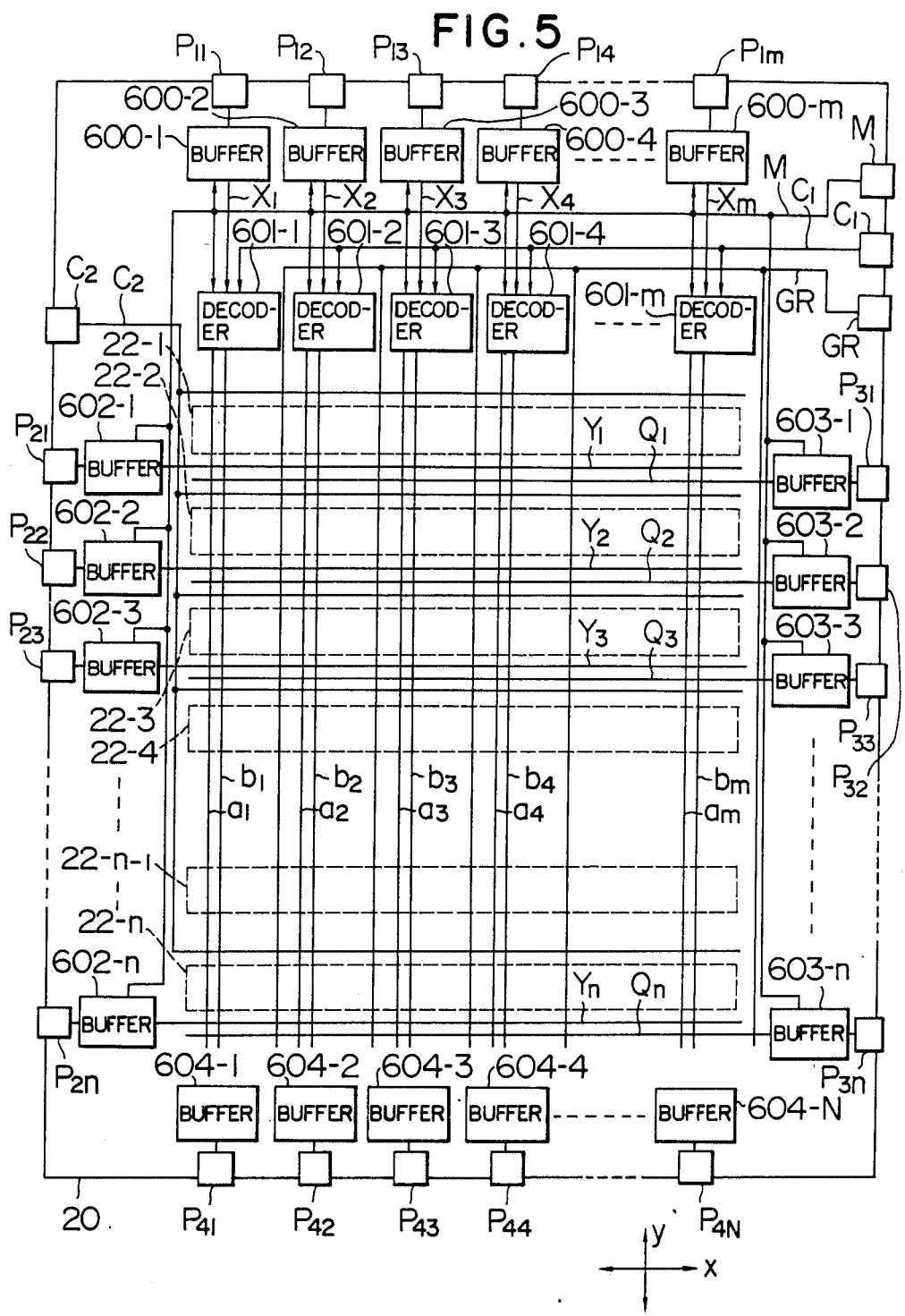
FIG. 5 is a schematic view showing the master chip structure of the embodiment shown in FIG. 2.

Next, explanation will be made on a master chip structure of the embodiment, that is, the gate array integrated circuit device 20, by reference to FIG. 5. As shown in FIG. 5, the master chip of the device 20 includes pads $P_{11}$ to $P_{1m}$ for specifying one of columns ($X_1$ to $X_m$) of a flip-flop matrix in a diagnostic mode, input/output buffers 600-1 to 600-m, column decoders 601-1 to 601-m for producing the column selecting signals $a_i$ and $b_i$, pads for diagnostic use only M, $C_1$, GR, and $C_2$, pads $P_{21}$ to $P_{2n}$ for specifying one of rows ($Y_1$ to $Y_n$) of the flip-flop matrix in a diagnostic mode, input/output buffers 602-1 to 602-n, pads $P_{31}$ to $P_{3n}$ for reading out one of data output signals ($Q_1$ to $Q_n$) in a diagnostic mode, input/output buffers 603-1 to 603-n, ordinary input/output pads $P_{41}$ to $P_{4N}$ independent of fault diagnosis, input/output buffers 604-1 to 604-N connected respectively to the pads $P_{41}$ to $P_{4N}$, and fundamental cell groups 22-1 to 22-n which are juxtaposed in a Y-direction, and each of which includes a multiplicity of fundamental cells (not shown) juxtaposed in an X-direction.

The functions of various pads in the ordinary and diagnostic modes will be listed in the following table.

TABLE 2

| mode | | pad M | $C_1$ | $C_2$ | $P_{11}$ to $P_{1m}$ | $P_{21}$ to $P_{2n}$ | $P_{31}$ to $P_{3n}$ |
|---|---|---|---|---|---|---|---|
| ordinary mode | | 1 | 1 | 1 | $P_{11}$ to $P_{1m}$ | $P_{21}$ to $P_{2n}$ | $P_{31}$ to $P_{3n}$ |
| diagnostic mode | scan in | 0 0 | | 0 | $X_1$ to $X_m$ | $Y_1$ to $Y_n$ | $Q_1$ to $Q_n$ |
| | flip-flop in | 1 | 1 | 0 | $P_{11}$ to $P_{1m}$ | $P_{21}$ to $P_{2n}$ | $P_{31}$ to $P_{3n}$ |
| | pin out | 1 | 0 | 0 | $P_{11}$ to $P_{1m}$ | $P_{21}$ to $P_{2n}$ | $P_{31}$ to $P_{3n}$ |
| | scan out | 0 | 0 | | $X_1$ to $X_m$ | $P_{21}$ to $P_{2n}$ | $Q_1$ to $Q_n$ |

Mode pad M

The pad M is an input pad for delivering the mode specifying signal which specifies either one of the diagnostic mode and ordinary mode. The diagnostic mode or ordinary mode is specified, depending upon whether the potential level of the pad M is "0" or "1".

First clock pad $C_1$

The pad $C_1$ is an input pad for delivering the first clock signal which determines a time the flip-flop 40 is set in a diagnosing mode.

Second clock pad $C_2$

The pad $C_2$ is an input pad for delivering the second clock signal which determines a time the data stored in the flip-flop 41 is delivered in a diagnostic mode. In an ordinary mode, however, the potential level of the pad $C_2$ is kept at "1" in order to always deliver the data set in the flip-flop 41.

Pads $P_{11}$ to $P_{1m}$

The pads $P_{11}$ to $P_{1m}$ function as input/output pads $P_{11}$ to $P_{1m}$ in an ordinary mode, and function as pads for column address signals $X_1$ to $X_m$, at the scan-in and scan-out operations in a diagnostic mode.

Pads $P_{21}$ to $P_{2n}$

The pads $P_{21}$ to $P_{2n}$ function as input/output pads $P_{21}$ to $P_{2n}$ in an ordinary mode, and function as pads for row address signals $Y_1$ to $Y_n$, at the scan-in operation in a diagnostic mode.

Pads $P_{31}$ to $P_{3n}$

The pads $P_{31}$ to $P_{3n}$ function as input/output pads $P_{31}$ to $P_{3n}$ in an ordinary mode, and function as pads for data output signals $Q_1$ to $Q_n$, at the scan-in and scan-out operations in a diagnostic mode.

The above-mentioned changes in function will be explained later in detail.

In the above-mentioned master chip, the following wiring groups (1) to (6) are previously and logically formed, and the physical connection between the wiring groups and part of a user logic circuit is fabricated on the master chip when the user logic circuit is formed. Alternatively, the wiring groups (1) to (6) are previously and physically fabricated by the first metal layer, and the above physical connection is fabricated by the multilayer wiring technique.

(1) Wiring between pads and input/output buffers

At a peripheral portion of the semiconductor chip, wiring is made between the pads $P_{11}$ to $P_{1m}$ and input/output buffers 600-1 to 600-m, between the pads $P_{21}$ to $P_{2n}$ and input/output buffers 602-1 to 602-n, between the pads $P_{31}$ to $P_{3n}$ and input/output buffers 603-1 to 603-n, and between the pads $P_{41}$ to $P_{4n}$ and input/output buffers 604-1 to 604-N. At a time immediately after the master chip has been fabricated, however, the inner wiring for all of the input/output buffers is put in a state that each input/output buffer can be used as a desired one of an input buffer, an output buffer and an input/output buffer. Further, it is not always required to use, in a diagnostic mode, all of the pads $P_{11}$ to $P_{1m}$ for specifying a column of the flip-flop matrix and all of the input/output buffers 600-1 to 600-m provided at the same side of the semiconductor chip as the above pads. The value of m is determined by the number of gates which are required in forming one flip-flop of part of the fundamental cell groups 22-1 to 22-n, and the area occupied by such gates. Similarly, part of the pads $P_{21}$ to $P_{2n}$ for row address signals $Y_1$ to $Y_n$ and corresponding ones of the input/output buffers 602-1 to 602-n may be used, and part of pads $P_{31}$ to $P_{3n}$ for data output signals $Q_1$ to $Q_n$ and corresponding ones of the input/output buffers 603-1 to 603-n may also be used. In some cases, an appropriate number of pad-input/output buffer pairs are not required to be used for diagnosis, even in a diagnostic mode.

(2) Wiring from pads for diagnostic use only M, GR, $C_1$ and $C_2$

In the present embodiment, the pads for diagnostic use only include the mode pad M, reset pad GR, first clock pad $C_1$ and second clock pad $C_2$. As shown in FIG. 5, wiring is made between these pads and various parts on the semiconductor chip so that the mode signal M, reset signal GR and clock signals $C_1$ and $C_2$ can be applied to desired parts on the semiconductor chip.

That is, the mode pad M is connected to input/output buffers 600-1 to 600-m, 602-1 to 602-n, and 603-1 to 603-n and column decoders 601-1 to 601-m. The clock pad $C_1$ is connected to the column decoders 601-1 to 601-m. Further, the wiring from the clock pad $C_2$ and the wiring from the reset pad GR are arranged in the form of a matrix, that is, in such a manner that the former wiring is extended along the X-direction, and the latter wiring is extended along the Y-direction.

(3) Wiring between input/output buffers 600-1 to 600-m and column decoders 601-1 to 601-m The input/output buffers 600-1 to 600-m are connected at the output sides thereof to the column decoders 601-1 to 601-m so that the column address signals $X_1$ to $X_m$ for a diagnostic mode can be applied to the column decoders.

(4) Wiring from input/output buffers 602-1 to 602-n

The row address signal line from the output side of each of the input/output buffers 602-1 to 602-n is extended in the X-direction to apply one of the row address signals $Y_1$ to $Y_n$ to flip-flops in a corresponding row. Accordingly, the row address signal lines from the buffers 602-1 to 602-n are parallel to each other.

(5) Wiring from input/output buffers 603-1 to 603-n

The data output signal line from the output side of each of the input/output buffers 603-1 to 603-n is extended in the X-direction to read out data from a flip-flop in a corresponding row, in a diagnostic mode. Accordingly, the data output signal lines from the buffers 603-1 to 603-n are parallel to each other.

(6) Wiring from column decoders 601-1 to 601-m

A pair of signal lines from the output side of each of the column decoders 601-1 to 601-m are extended in the Y-direction to apply a pair of column selecting signals $a_i$ and $b_i$ to flip-flops in a corresponding column. Accordingly, the signal line pairs from the column decoders are parallel to each other.

As mentioned above, in order to be able to diagnose the gate array integrated circuit device 20, the master chip of the device 20 includes input/output buffers capable of performing a different function in a diagnostic mode, column decoders, pads for diagnostic use only, and wiring groups extended along the x- and y-directions.

Next, the details of the input/output buffers and column decoders will be explained, with reference to FIGS. 6 to 8.

Figure 6:
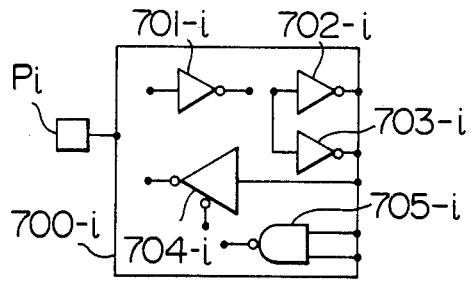
FIGS. 6a–d and 7a–d are views showing circuit configurations of the input/output buffers shown in FIG. 5.
Figure 6:
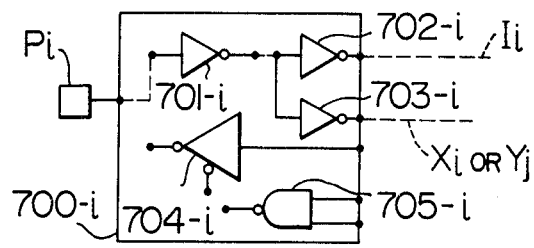
Figure 6:
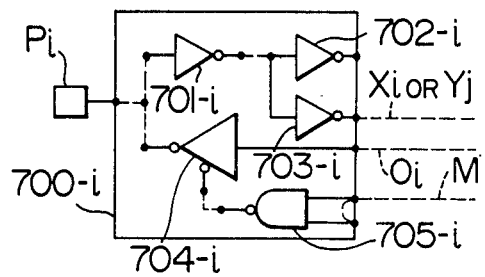
Figure 6:
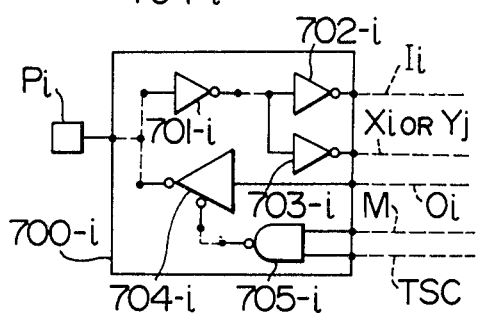

FIG. 6 shows the master chip structure of input/output buffers 600-1 to 600-m for delivering a column selecting signal $X_i$ and input/output buffers 602-1 to 602-n for delivering data at the scan-in operation, and further shows modified versions of the master chip structure.

Part a of FIG. 6 shows the above-mentioned master chip structure. A pad $P_i$ is connected to an input/output buffer master chip 700-i. An input buffer 701-i at the first stage, another input buffer 702-i at the second stage, a buffer 703-i for delivering column address signals $X_1$ to $X_m$ or row address signals $Y_1$ to $Y_n$ in a diagnostic mode, a 3-state output buffer 704-i, and a 2-input NAND gate 705-i for controlling the 3-state output buffer 705-i are provided on the buffer master chip 700-i so that these elements 701-i, 702-i, 703-i, 704-i and 705-i are independent of each other. The above master chip can be used as three kinds of buffers by forming appropriate wiring between these elements.

Case I: Master chip is used as input buffer in ordinary mode (part b of FIG. 6)

The pad $P_i$ is connected to the input buffer 701-i at the first stage, and the output terminal of which is connected to the input buffer 702-i and buffer 703-i, as indicated by broken lines. Thus, not only an input signal $I_i$ in an ordinary mode but also the column address signal $X_i$ or row address signal $Y_i$ in a diagnostic mode can be delivered. The output buffer 704-i and NAND gate 705-i are not used.

Case II: Master chip is used as output buffer in ordinary mode (part c of FIG. 6)

The pad $P_i$ is connected to the input buffer 701-i at the first stage and the output buffer 704-i, the output terminal of the input buffer 701-i is connected to the buffers 702-i and 703-i, two input terminals of the NAND gate 705-i are connected to each other, and the output terminal of the NAND gate 705-i is connected to the control terminal of the 3-stage output buffer 704-i (as indicated by broken lines). Thus, the column address signal $X_i$ or row address signal $Y_j$ in a diagnostic mode can be delivered. In an ordinary mode, output data or a signal $O_i$ is delivered from the $P_i$ under the control of the gate 705-i. In a diagnostic mode, the 3-state output buffer 704-i takes a high-impedance state, and the pad $P_i$ receives the column address signal $X_i$ or row address signal $Y_j$ supplied from the outside.

Case III: Master chip is used as input/output buffer in ordinary mode (part d of FIG. 6)

The pad $P_i$ is connected to the input buffer 701-i at the first stage and the output buffer 704-i, the output terminal of the input buffer 701-i is connected to the buffers 702-i and 703-i, and the output terminal of the NAND gate 705-i is connected to the control terminal of the output buffer 704-i. Thus, in an ordinary mode, it is possible to apply input data or the signal $I_i$ to the pad $P_i$ and to deliver output data or the signal $O_i$ from the pad $P_i$. It is to be noted that, when the mode specifying signal M takes the level of "1", the output buffer 704-i can be controlled by a 3-state control signal TSC. In a diagnostic mode, the output buffer 704-i takes a high-impedance state since the mode specifying signal M takes the level of "0", and the pads $P_i$ receives the column address signal $X_i$ or row address signal $Y_j$ supplied from the outside.

Figure 7:
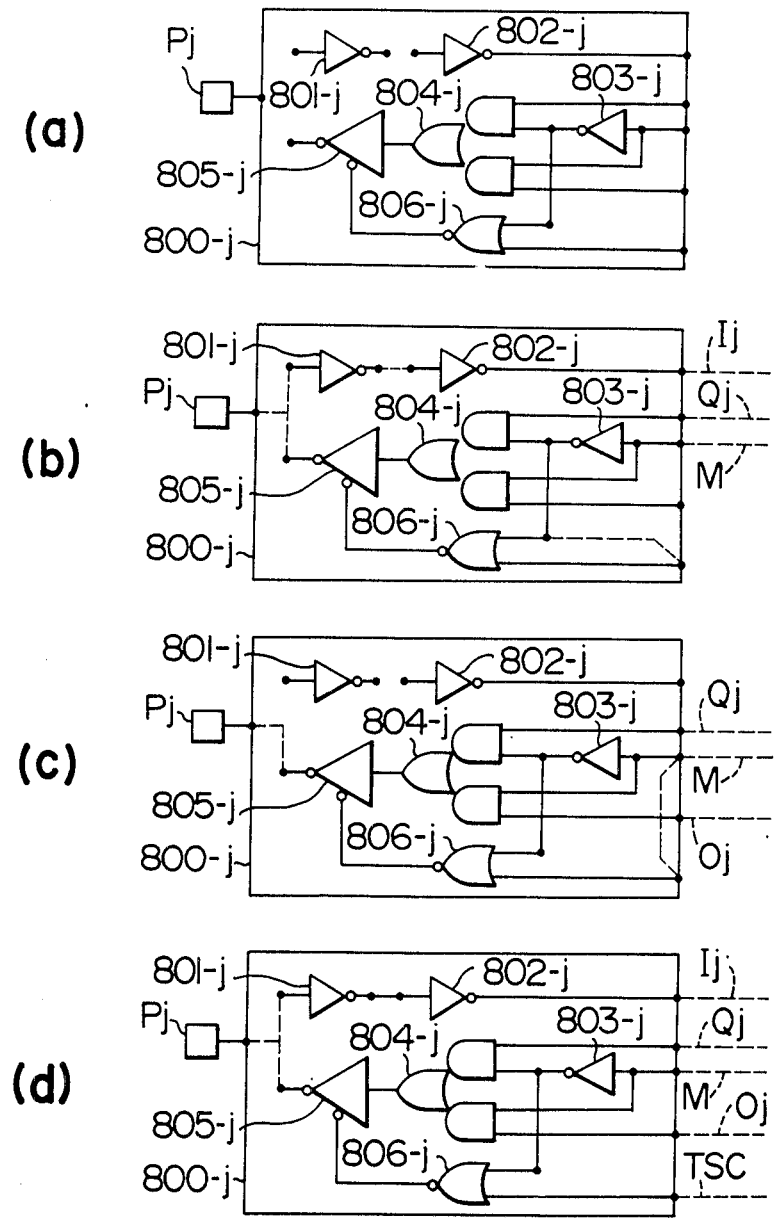

FIG. 7 shows the master chip structure of the input/output buffers 603-1 to 603-n for reading out data from flip-flops, and modified versions of the master chip structure.

Part a of FIG. 7 shows the above-mentioned master chip structure. A pad $P_j$ is connected to an input/output buffer master chip 800-j, which includes an input buffer 801-j at the first stage, an input buffer 802-j at the second stage, an inverter 803-j for the mode specifying signal M, a selective gate 804-j for selecting one of the data output signal $Q_j$ read out from a flip-flop in a diagnostic mode and the output signal $O_j$ in an ordinary mode, a 3-state output buffer 805-j, and a NOR gate 806-j for controlling the output buffer 805-j.

Parts b, c and d of FIG. 7 show the wiring for using the master 800-j as an input buffer in an ordinary mode, the wiring for using the master chip as an output buffer in the ordinary mode, and the wiring for using the master chip as an input/output buffer in the ordinary mode, respectively. Though the buffers shown in the parts b, c and d of FIG. 7 are different from the buffers shown in the parts b, c and d of FIG. 6 in constituent element and wiring pattern, the former buffers are formed in a similar manner to the latter buffers. Therefore, detailed explanation of the buffers shown in the parts b, c and d of FIG. 7 will be omitted.

Figure 8:
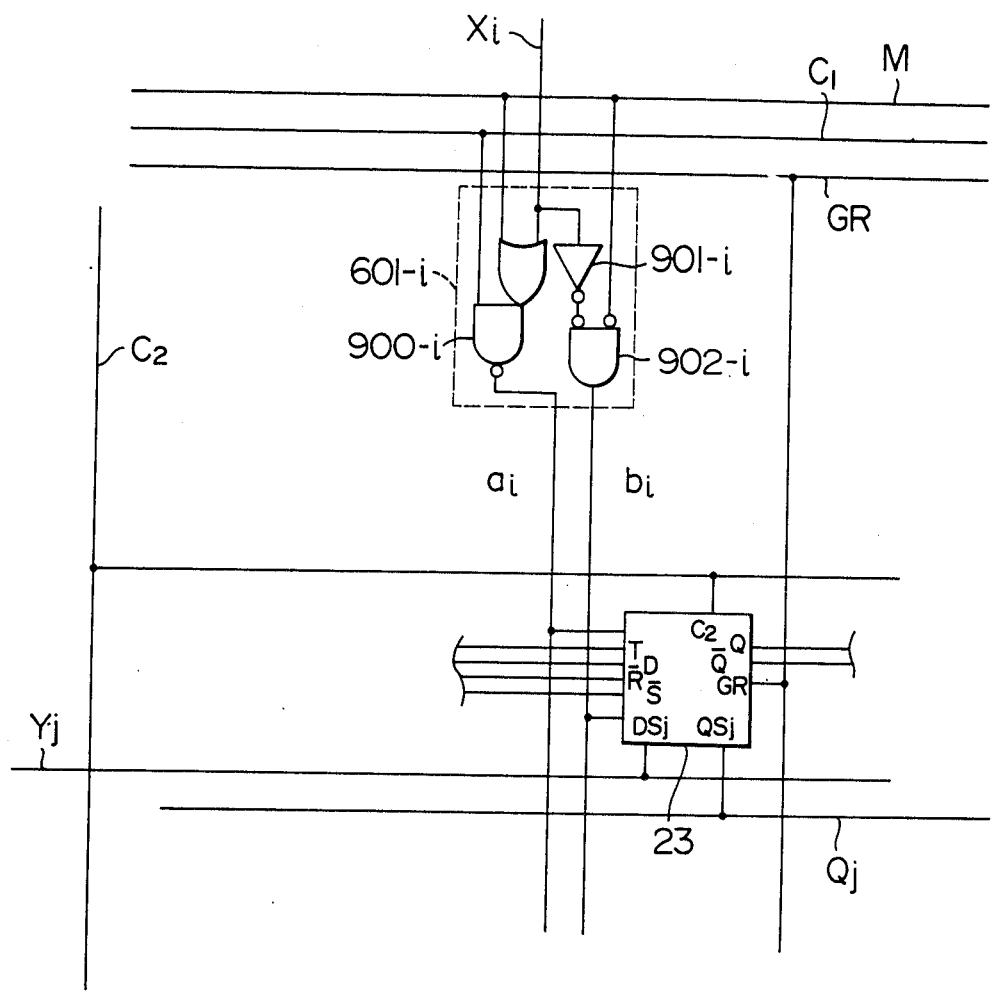
FIG. 8 is a view showing the circuit configuration of the column decoder shown in FIG. 5.

FIG. 8 shows the circuit configuration of each of the column decoders 601-1 to 601-m and the wiring for each column decoder. A column decoder 601-i includes gates 900-i, 901-i and 902-i. Further, the column decoder 601-i is applied with the column address signal $X_i$ which is supplied from the above-mentioned buffer in a diagnostic mode, the mode specifying signal M and the clock signal $C_1$, and delivers a pair of flip-flop selecting signals $a_i$ and $b_i$. The signal $a_i$ is formed by a logical operation which is expressed by the equation (1) and performed by the gate 900-i, and the signal $b_i$ is formed by a logical operation which is expressed by the equation (2) and performed by the gates 901-i and 902-i.

As mentioned previously, the flip-flop 23 in the j-th row, the i-th column is specified by the column signals $a_i$ and $b_i$ and row address signal $Y_j$ to set a value "1" in the flip-flop 23. Further, the contents of the flip-flop 23 are delivered, as the output signal $Q_j$, to a data output signal line on the basis of the column signals $a_i$ and $b_i$, and then sent to a pad $P_{3j}$ through an input/output buffer 603-j.

Figure 9:
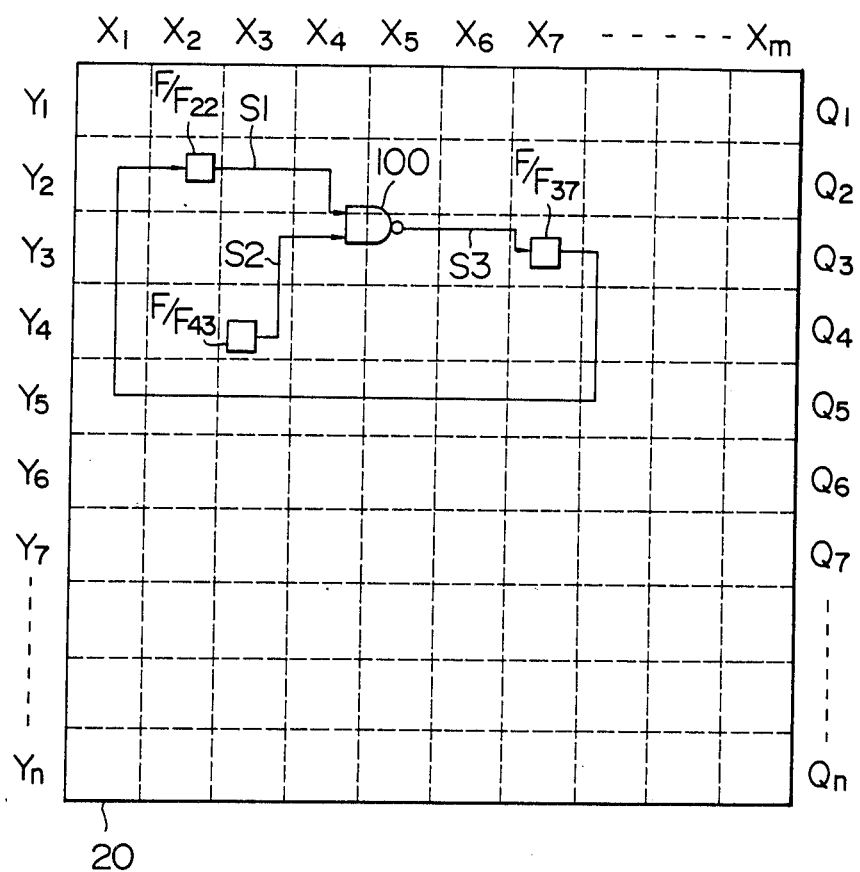
FIG. 9 is a view for explaining an example of the fault diagnosis for the embodiment shown in FIG. 2.

Next, an example of the diagnosis for the present embodiment will be explained below in detail, with reference to FIG. 9. Referring to FIG. 9, the gate array integrated circuit device 20 is divided into m × n blocks arranged in n rows and m columns so that only a single flip-flop is assigned to one block, to carry out the diagnosis.

Now, let us consider the case where flip-flops F/F$_{22}$, F/F$_{43}$, and F/F$_{37}$ are placed in the second row, the second column of the device 20, the fourth row, the third column of the device 20, and the third row, the seventh column of the device 20, respectively, the outputs of the flip-flops F/F$_{22}$ and F/F$_{43}$ are applied to a 2-input NAND gate 100 which is a combinational circuit, and the output of the NAND gate 100 is applied to the flipflop F/F$_{37}$, by way of example. The fault diagnosis in this case will be described briefly in the following table, and explained below in detail.

TABLE 3

| Step | | M | C$_1$ | C$_2$ | X$_i$ | Y$_j$ | Q$_j$ |
|---|---|---|---|---|---|---|---|
| 1 | GR (general reset) | X | X | X | X | X | X |
| 2 | scan-in operation for F/F$_{43}$ | 0 | | | X$_3$=1 | Y$_4$=1 | Q$_4$=1* |
| 3 | data setting at F/F$_{37}$ | 1 | 1 | 0 | X | X | X |
| 4 | scan-out operation for F/F$_{37}$ | 0 | 0 | | X$_7$=1 | X | Q$_3$=1** |
| 5 | GR (general reset) | X | X | X | X | X | X |
| 6 | scan-in operation for F/F$_{22}$ | 0 | | | X$_2$=1 | Y$_2$=1 | Q$_2$=1* |
| 7 | data setting at F/F$_{37}$ | 1 | 1 | 0 | X | X | X |
| 8 | scan-out operation for F/F$_{37}$ | 0 | 0 | | X$_7$=1 | X | Q$_3$=1** | where mark X means "Don't care", * indicates an output signal level in the case where the flip-flap F/F$_{43}$ operates normally, and ** indicates an output signal level in the case where the NAND gate 100 operates normally.

Now, the steps 1 to 8 will be explained in detail.

Step 1

The general reset signal GR is applied to the gate array integrated circuit device 20, to reset all flip-flops included in the device 20. At this time, the input and output signals M, C$_1$, C$_2$, X$_1$ to X$_m$, Y$_1$ to Y$_n$, and Q$_1$ to Q$_n$ are meaningless. In this step, the contents of each of the flip-flops F/F$_{22}$, F/F$_{43}$ and F/F$_{37}$ are made equal to an initial value "0".

Step 2

The combinational circuit to be diagnosed in the present example is the 2-input NAND gate 100. First, the flip-flop F/F$_{43}$ is set to the level "1", to supply two input values "0" and "1" to the NAND gate 100. As shown in the table 3, in order to set the value "1" in the flip-flop F/F$_{43}$, the mode specifying signal M is brought to the level of "0", the flip-flop F/F$_{43}$ is selected by the column address signal X$_3$ and row address signal Y$_4$, and the clock signals C$_1$ and C$_2$ are applied to the flip-Flop F/F$_{43}$. The clock signal C$_1$ sets the value "1" in the flip-flop 40 of the flip-flop 23 which is shown in FIG. 4 and corresponds to the flip-flop F/F$_{43}$, and the clock signal C$_2$ sets the value "1" in the flip-flop 41 (shown in FIG. 4). The contents of the flip-flop 23 (that is, flip-flop F/F$_{43}$) are delivered, as an output signal Q$_4$, to the outside of the device 20 through the output gate 51 and an output signal line. When the value "1" is normally set in the flip-flop F/F$_{43}$, an output signal having the level of "1" is delivered from the pad P$_{34}$ shown in FIG. 5.

Thus, two input signals S$_1$ and S$_2$ of the 2-input NAND gate 100 which is the combinational circuit to be diagnosed, take the level of "0" and the level of "1" respectively.

Step 3

As mentioned above, the input signals S$_1$ and S$_2$ are applied to the NAND gate 100 in step 2. When the NAND gate 100 and two input lines thereto operate normally, an output signal S$_3$ from the gate 100 takes the level of "1". In the present step, the following processing is carried out to store the level of the signal S$_3$ in the flip-flop F/F$_{37}$. First, the level of the mode specifying signal M is made equal to "1", to put the device 20 in an ordinary mode, and the level of the clock signal C$_1$ is also made equal to "1". Then, the level of the signal S$_3$ (that is, the signal D shown in FIG. 4) is set in the flip-flop 40 shown in FIG. 4, by the clock signal T supplied to the device 20. At this time, the level of the clock signal C$_2$ is made equal to "0" for the following reason. That is, the phase relation between the the clock signal T applied to the flip-flop 23 of FIG. 4 and the clock signals C$_1$ and C$_2$ is uncertain. Accordingly, when the clock signals T and C$_2$ are in phase, troubles may arise in a logic circuit which is formed of a loop including the flip-flop 23. That is, in the case where the output of the flip-flop F/F$_{37}$ is fed back to the flip-flop 22, the level of the signal S$_1$ is changed from "0" to "1", and oscillation is generated.

In the present step, the output of the NAND gate 100 is sent, as the signal S$_3$, to the flip-flop F/F$_{37}$ and set therein, in the above-mentioned manner.

Step 4

The gate array integrated circuit device 20 is again put in a diagnostic mode and the column address signal X$_7$ is brought to the level of "1". Further, the clock signal C$_2$ is applied to the flip-flop 41 (shown in FIG. 4), to set the contents of the flip-flop 40 in the flip-flop 41. When the NAND gate 100 operates normally, the contents of the flip-flop 40 are equal to "1", and therefore the contents of the flip-flop 41 are also equal to "1". The contents of the flip-flop 41 are sent out, as the output signal Q$_j$, to a data output signal line through the output gate 51. The contents of the flip-flop F/F$_{37}$ are delivered to the pad P$_{33}$ in the above-mentioned manner. Thus, the contents of the flip-flop F/F$_{37}$ can be checked at the outside of the gate array integrated circuit device 20. When the logical operation performed by the NAND gate 100 is normal and the signal lines for transmitting the signals S$_1$, S$_2$ and S$_3$ are not defective, the output signal Q$_3$ of the flip-flop F/F$_{37}$ takes the level of "1".

Steps 5 to 8

The processing in steps 5 to 8 is similar to that in steps 1 to 4. That is, a similar diagnosis is made in the state that the levels of the signals S$_1$ and S$_2$ applied to the NAND gate 100 are reversed. When no abnormality is found in steps 1 to 8, the NAND gate 100 (which is a combinational circuit) and the wiring thereto are judged to be normal.

In the above description, the case where the outputs of two flip-flops F/F$_{22}$ and F/F$_{43}$ are applied to the 2-input NAND gate 100 and the output of the gate 100 is applied to the flip-flop F/F$_{37}$, has been explained, by way of example. However, the diagnosis for an integrated circuit device is not limited to the above-mentioned case, but is applicable to any case where each of the input and output terminals of a combinational circuit is connected to a memory circuit such as a flip-flop. The shift register 14 shown in FIG. 1 can be diagnosed, since the conductor 8 is a kind of combinational circuit.

Further, in the case where the number N of flip-flops connected to the input side of a combinational circuit is greater than two, the rate of diagnosis can be increased by repeating the processing in steps 1 to 4, N times.

In the above description, the fault diagnosis for a simple circuit has been explained, by way of example. In actual facts, however, it is required to diagnose a large number of complicated circuits at one time. In order to satisfy the above requirement, it is necessary to set the value "1" in a large number of flip-flops in one step.

As is apparent from the wiring pattern of the present embodiment, the value "1" can be set in one or more flip-flops on the gate array integrated circuit device 20 in one step, as mentioned below.

(a) Setting of "1" in signal flip-flop

As in the above-mentioned example, the value "1" can be set in one flip-flop in the j-th row, the i-th column by bringing each of the column address signal X$_i$ and row address signal Y$_j$ to the level of "1".

(b) Setting of "1" in flip-flop group in one row

In the case where the value "1" is set in some flip-flops selected from the flip-flop group in the j-th row, the row address signal Y$_j$ is brought to the level of "1", and corresponding ones of the column address signals X$_1$ to X$_m$ are brought to the level of "1". When the signals X$_1$ to X$_7$ are brought to the level of "1", the value "1" is set in seven flip-flops F/F$_{j1}$ to F/F$_{j7}$ at the same time.

(c) Setting of "1" in flip-flop group in one column

In the case where the value "1" is set in some flip-flops selected from the flip-flop group in the i-th column, the column address signal X$_i$ is brought to the level of 7 1", and corresponding ones of the row address signals Y$_1$ to Y$_n$ are brought to the level of "1". When the signals X$_1$ to X$_4$ are brought to the level of "1", the value "1" is set in four flip-flops F/F$_{1i}$ to F/F$_{4i}$.

(d) Setting of "1" in all flip-flops

When all of the column address signals X$_1$ to X$_m$ and row address signals Y$_1$ to Y$_n$ are brought to the level of "1", the value "1" is set in all flip-flops on the gate array integrated circuit device.

In short, the value "1" can be set in flip-flops specified by two-dimentional addresses which are formed of some of the column address signals X$_1$ to X$_m$ and some of the row address signals Y$_1$ to Y$_n$. It is needless to say that a value "0" can be set in all flip-flops by the reset signal GR.

Next, explanation will be made on how memory circuits such as flip-flops are arranged on the gate array integrated circuit device 20 and how the memory circuits are connected to a combinational circuit, by reference to FIG. 10.

Figure 10:
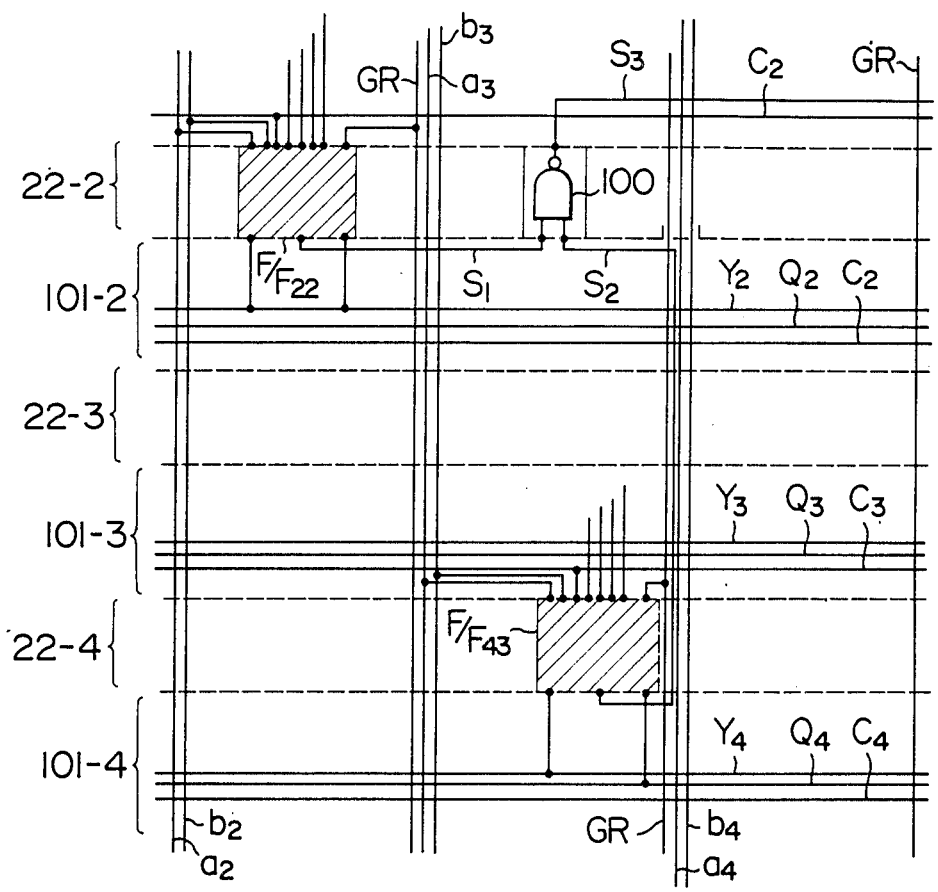
FIG. 10 is a view showing a wiring pattern formed on the embodiment shown in FIG. 2.

Referring to FIG. 10, fundamental cell groups 22-2, 22-3 and 22-4 are juxtaposed with a wiring region 101-2, 101-3, or 101-4 therebetween, and the wiring regions have predetermined width. Further, conductors between logic circuits for transmitting the signals S$_1$, S$_2$ and S$_3$ and signal lines for transmitting the signals a$_i$, b$_i$, C$_2$, Y$_j$, Q$_j$ and GR in a diagnostic mode are connected to desired logic circuits by the multi-layer wiring technique through an insulating film (not shown).

As shown in FIG. 10, even if each of the flip-flops F/F$_{22}$ and F/F$_{43}$ is formed in any one of the fundamental cells included in the cell groups 22-2, 22-3 and 22-4, the flip-flops F/F$_{22}$ and F/F$_{43}$ can be connected to the signal lines for diagnostic use, and thus the row and column addresses of each flip-flop can be specified by means of the above signal lines.

As has been explained in the above description, in the embodiment of the gate array integrated circuit according to the present invention, not only setting, resetting and reading operations can be performed for a flip-flop which is a memory circuit, but also a fault diagnosis can be carried out for individual combinational circuits. Therefore, the rate of diagnosis can be enhanced. Further, when a fault diagnosis is carried out for an integrated circuit device including a great number of regularly arranged gates such as a gate array integrated circuit device, setting and resetting operations for every flip-flop can be controlled by signal lines which are regularly arranged. Accordingly, an increase in chip area caused by the fault diagnosis can be made as small as possible, and moreover the fault diagnosis for the integrated circuit device can be made at a rate of diagnosis of 100% and at high speed.

As has been explained in the foregoing, according to the present invention, there are provided an integrated circuit device in which individual combinational circuits can be diagnosed and a satisfactory rate of diagnosis is obtained, and a method of diagnosing the integrated circuit device.

What is claimed is:

1. A method for testing an integrated circuit having a plurality of combinational circuits, a plurality of input memory circuits and a plurality of output memory circuits, wherein said combinational circuits, said input memory circuits and said output memory circuits are arranged so that each combinational circuit has an input memory circuit coupled to an input thereof and an output memory circuit coupled to an output thereof, said method comprising:
    (a) selectively storing diagnostic input data to be used in diagosing a predetermined combinational circuit to be tested in a predetermined input memory circuit coupled to an input of said predetermined combinational circuit;
    (b) operating said predetermined combinational circuit to be tested to perform a predetermined operation on said diagnostic data stored in said predetermined input circuit;
    (c) storing the results of said predetermined operation of said predetermined combinational circuit as diagnostic output data in a predetermined output memory circuit coupled to an output of said predetermined combinational circuit; and
    (d) selectively reading out said stored diagnostic output data from said predetermined output memory circuit.

2. A method according to claim 1, wherein said integrated circuit further includes means for placing said integrated circuit in a test mode for selective write-in or read-out of diagnostic data, and means for placing said integrated circuit in a normal mode for carrying out a predetermined normal operation in said combinational circuit, wherein said method further comprises:

placing said integrated circuit into said test mode for the selective storing of diagnostic input data into said predetermined input memory device;

placing said integrated circuit into said normal mode for the operation of said predetermined combinational circuit to perform the predetermined operation on diagnostic data stored in the predetermined input memory circuit, wherein said predetermined operation is the same as said predetermined normal operation; and placing said integrated circuit into said test mode for the selective read-out of the diagnostic output data stored in said predetermined output memory.

3. A method according to claim 2, wherein N (n≧1) input memory circuits are connected to the the input of each combinational circuit and M (m≧1) output memory circuits are coupled to the output side of each combinational circuit, said method further comprising:

resetting said N input memory circuits and said M output memory circuits to a predetermined initial state before carrying out steps (a) through (d).

4. A method according to claim 2, wherein steps (a) through (d) are repeated for all of said combinational circuits in accordance with a predetermined order.

5. A method according to claim 1, wherein N (n≧1) input memory circuits are connected to the input of each combinational circuit and M (m≧1) output memory circuits are coupled to the output side of each combinational circuit, said method further comprising:

resetting said N input memory circuits and said M output memory circuits to a predetermined initial state before carrying out steps (a) through (d).

6. A method according to claim 5, wherein steps (a) through (d) are repeated for all of said combinational circuits in accordance with a predetermined order.

7. A method according to claim 1, wherein steps (a) through (d) are repeated for all of said combinational circuits in accordance with a predetermined order.

8. An apparatus for testing an integrated circuit having a plurality of combinational circuits, a plurality of input memory circuits and a plurality of output memory circuits, wherein said combinational circuits, said input memory circuits and said output memory circuits are arranged so that each combinational circuit has an input memory circuit coupled to an input thereof and an output memory circuit coupled to an output thereof, said apparatus further comprising:

means for selectively storing diagnostic input data to be used in diagnosing a predetermined combinational circuit to be tested in a predetermined input memory circuit coupled to an input of said predetermined combinational circuit;

means for operating said predetermined combinational circuit to be tested to perform a predetermined operation on said diagnostic data stored in said predetermined input circuit;

means for storing the results of said predetermined operation of said predetermined combinational circuit as diagnostic output data in a predetermined output memory circuit coupled to an output of said predetermined combinational circuit; and means for selectively reading out said stored diagnostic output data from said predetermined output memory circuit.

9. An apparatus according to claim 8, further comprising:

a plurality of input/out pads formed on a peripheral portion of a chip on which the integrated circuit is formed; and a plurality of input/output buffers coupled between said plurality of input/output pads and said plurality of input and output memory circuits, wherein said means for selectively storing diagnostic input data comprises means for providing a first address to said plurality of input/output buffers for selecting a predetermined one of said input memory circuits to store input diagnostic data to be used for diagnosing a combinational circuit coupled to said selected input memory circuit, and wherein said means for selectively reading out stored diagnostic output data comprises means for providing a second address to said plurality of input/output buffers for selecting a predetermined one of said output memory circuits to read out said stored diagnostic output data.

10. An apparatus according to claim 8, wherein each of said input memory circuits and each of said output memory circuits is comprises of a flip-flop circuit.

* * * * *